United States Patent
Dhanasekaran

(10) Patent No.: US 8,896,383 B2
(45) Date of Patent: Nov. 25, 2014

(54) ENHANCED PULSE FREQUENCY MODULATION (PFM) CONTROL MODE FOR SWITCHING REGULATORS

(75) Inventor: Vijayakumar Dhanasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 71 days.

(21) Appl. No.: 13/612,109

(22) Filed: Sep. 12, 2012

(65) Prior Publication Data

US 2013/0285751 A1 Oct. 31, 2013

Related U.S. Application Data

(60) Provisional application No. 61/640,390, filed on Apr. 30, 2012.

(51) Int. Cl.
| | | |
|---|---|---|
| *H03F 3/04* | (2006.01) | |
| *H03F 1/02* | (2006.01) | |
| *H03F 3/21* | (2006.01) | |
| *H03F 3/68* | (2006.01) | |
| *H02M 3/157* | (2006.01) | |

(52) U.S. Cl.
CPC ............ *H03F 3/21* (2013.01); *H02M 3/157* (2013.01); *H03F 1/0227* (2013.01); *H03F 3/68* (2013.01)
USPC .......................................... 330/297; 330/296

(58) Field of Classification Search
USPC .................... 330/297, 129, 136, 285, 296
See application file for complete search history.

(56) References Cited

U.S. PATENT DOCUMENTS

| | | | |
|---|---|---|---|
| 5,606,289 A | 2/1997 | Williamson | |
| 5,635,872 A * | 6/1997 | Zimmerman | 330/128 |
| 6,509,722 B2 * | 1/2003 | Lopata | 323/280 |
| 7,221,130 B2 | 5/2007 | Ribeiro et al. | |
| 7,782,141 B2 | 8/2010 | Witmer et al. | |
| 8,072,266 B1 | 12/2011 | Hoomes et al. | |
| 8,344,806 B1 * | 1/2013 | Franck et al. | 330/285 |
| 8,395,365 B2 * | 3/2013 | Latham et al. | 323/283 |
| 2005/0184809 A1 * | 8/2005 | Can et al. | 330/298 |
| 2006/0181340 A1 * | 8/2006 | Dhuyvetter | 330/6 |
| 2010/0156517 A1 | 6/2010 | Lin et al. | |
| 2010/0164630 A1 | 7/2010 | Witmer et al. | |
| 2011/0273150 A1 | 11/2011 | Dowlatabadi | |
| 2012/0025736 A1 | 2/2012 | Singh et al. | |

FOREIGN PATENT DOCUMENTS

| | | |
|---|---|---|
| EP | 0777320 A1 | 6/1997 |
| EP | 1895648 A2 | 3/2008 |
| GB | 2345212 A | 6/2000 |

OTHER PUBLICATIONS

Ma et al. "Enabling Power-Efficient DVFS Operations on Silicon," IEEE Circuits and Systems Magazine, 2010. pp. 24-17, vol. 10, No. 1.
International Search Report—PCT/US2013/038925—ISA/EPO—Oct. 31, 2013.

* cited by examiner

*Primary Examiner* — Henry Choe

(57) ABSTRACT

A variable supply rail generator is described. The variable supply rail generator includes a regulator configured to use an estimated load current for a power amplifier to optimize efficiency. The variable supply rail generator also includes a power amplifier controller. The power amplifier controller provides the estimated load current to the regulator.

24 Claims, 8 Drawing Sheets

ENHANCED PULSE FREQUENCY MODULATION (PFM) CONTROL MODE FOR SWITCHING REGULATORS

CLAIM OF PRIORITY UNDER 35 U.S.C. §119

The present application for patent claims priority to Provisional Application No. 61/640,390, entitled "ENHANCED PFM CONTROL MODE FOR SWITCHING REGULATORS WITH PREDICTABLE LOAD" filed Apr. 30, 2012, and assigned to the assignee hereof and hereby expressly incorporated by reference herein.

TECHNICAL FIELD

The present disclosure relates generally to wireless communication systems. More specifically, the present disclosure relates to systems and methods for an enhanced pulse frequency modulation (PFM) control mode for switching regulators.

BACKGROUND

Wireless devices have become smaller and more powerful in order to meet consumer needs and to improve portability and convenience. Consumers have become dependent upon wireless devices such as cellular telephones, personal digital assistants (PDAs), laptop computers and the like. Consumers have come to expect reliable service, expanded areas of coverage and increased functionality.

Wireless devices may primarily operate using batteries. Thus, the power efficiency of a wireless device has a high priority. Furthermore, wireless devices are typically small and compact. Reductions in the die area used for circuitry in a wireless device may reduce both the size and cost of a wireless device. Finally, an increase in power efficiency may result in less heat dissipation by the wireless device. Thus, benefits may be realized by improvements to wireless devices that reduce the size and cost of the wireless device while increasing the power efficiency.

SUMMARY

A variable supply rail generator is described. The variable supply rail generator includes a regulator configured to use an estimated load current for a power amplifier to optimize efficiency. The variable supply generator also includes a power amplifier controller that provides the estimated load current to the regulator.

The regulator may be a buck regulator. The buck regulator may provide a positive variable supply rail to the power amplifier. The variable supply rail generator may also include a negative charge pump. The buck regulator may provide a positive variable supply rail to the negative charge pump. The negative charge pump may provide a negative variable supply rail to the power amplifier.

The power amplifier controller may provide a variable frequency clock signal to the negative charge pump that optimizes the power efficiency of the negative charge pump. The power amplifier controller may also provide a reference signal corresponding to prior knowledge of an input signal in a digital signal chain to the buck regulator via a digital-to-analog converter.

The variable supply rail generator may include a flyback regulator. The power amplifier controller may provide the estimated load current to the flyback regulator. The buck regulator may provide a positive variable supply rail to the power amplifier. The flyback regulator may provide a negative variable supply rail to the power amplifier. The power amplifier controller may provide a reference signal corresponding to prior knowledge of an input signal in a digital signal chain to the buck regulator and the flyback regulator via a digital-to-analog converter.

The variable supply rail generator may operate in an enhanced pulse frequency modulation mode. The estimated load current may be dependent on peak/valley current boundaries. The current boundaries may be set around a current limit when an output voltage drops below a reference voltage.

The estimated load current may include a power amplifier current and a filter capacitor current. The power amplifier current may be based on an input voltage, a load resistance and a tolerance. The filter capacitor current may be determined from a rate of change of an envelope. The load resistance used for the estimated load current may be based on an adaptive value from an impedance detection module.

A method for generating a variable supply rail is also described. An input parameter corresponding to a power amplifier is received. A load current for the power amplifier is estimated using the input parameter. A positive variable supply rail is generated using the estimated load current. The positive variable supply rail is provided to the power amplifier. A negative variable supply rail is generated using the estimated load current. The negative variable supply rail is provided to the power amplifier.

The positive variable supply rail may be generated using a buck regulator. The negative variable supply rail may be generated using a negative charge pump or a flyback regulator.

An apparatus configured for generating a variable supply rail is described. The apparatus includes means for receiving an input parameter corresponding to a power amplifier. The apparatus also includes means for estimating a load current for the power amplifier using the input parameter. The apparatus further includes means for generating a positive variable supply rail using the estimated load current. The apparatus also includes means for providing the positive variable supply rail to the power amplifier. The apparatus further includes means for generating a negative variable supply rail using the estimated load current. The apparatus also includes means for providing the negative variable supply rail to the power amplifier.

A computer-program product for generating a variable supply rail is also described. The computer-program product includes a non-transitory computer-readable medium having instructions thereon. The instructions include code for causing a variable supply rail generator to receive an input parameter corresponding to a power amplifier. The instructions also include code for causing the variable supply rail generator to estimate a load current for the power amplifier using the input parameter. The instructions further include code for causing the variable supply rail generator to generate a positive variable supply rail using the estimated load current. The instructions also include code for causing the variable supply rail generator to provide the positive variable supply rail to the power amplifier. The instructions further include code for causing the variable supply rail generator to generate a negative variable supply rail using the estimated load current. The instructions also include code for causing the variable supply rail generator to provide the negative variable supply rail to the power amplifier.

DETAILED DESCRIPTION

Figure 1:
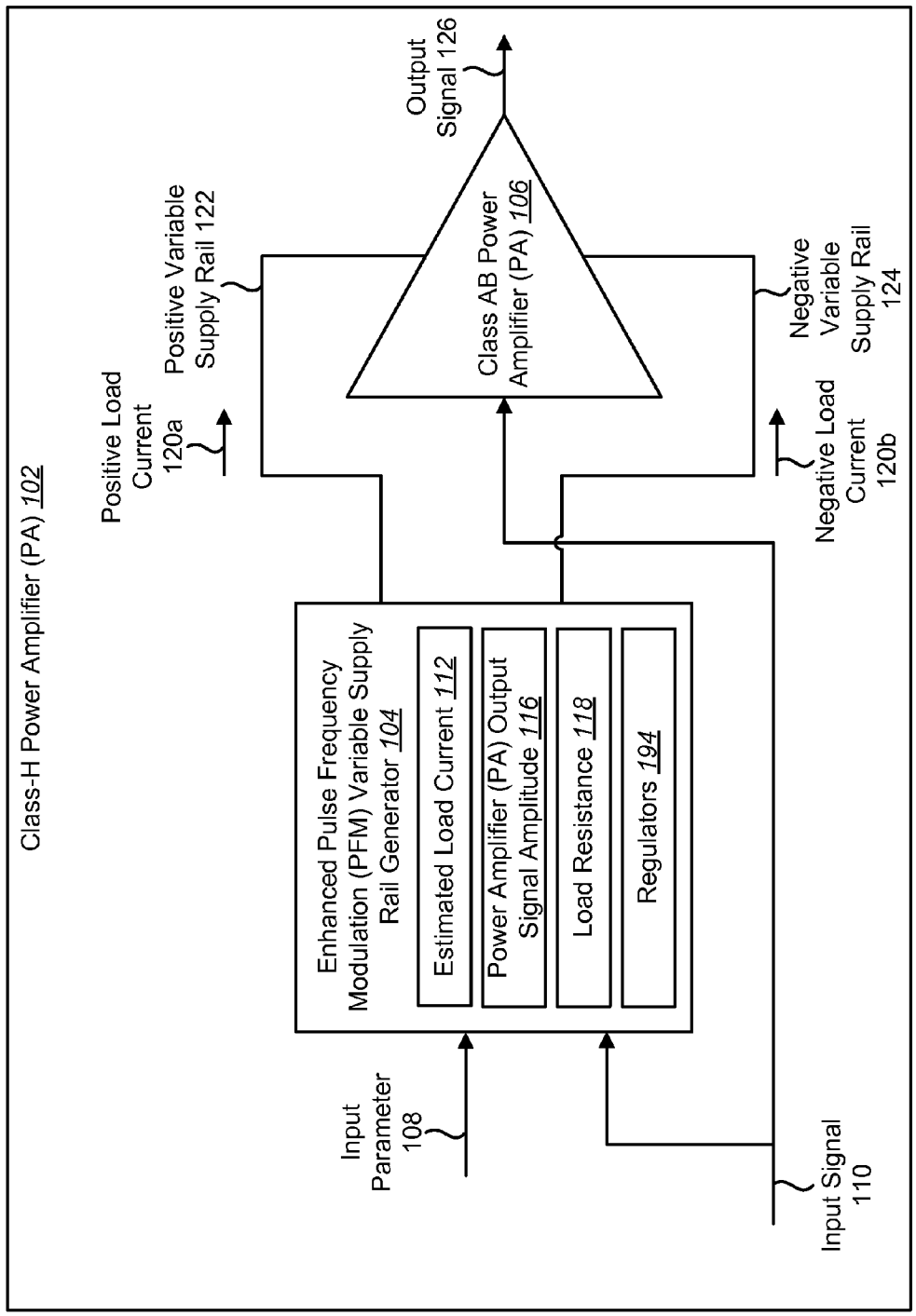
FIG. 1 shows a class-H power amplifier with enhanced pulse frequency modulation (PFM) control mode regulators for use in the present systems and methods.

FIG. 1 shows a class-H power amplifier 102 with enhanced pulse frequency modulation (PFM) control mode regulators for use in the present systems and methods. The class-H power amplifier 102 may be part of an integrated circuit. In one configuration, the class-H power amplifier 102 may be part of a power management integrated circuit (PMIC). The class-H power amplifier 102 may include an enhanced pulse frequency modulation (PFM) variable supply rail generator 104 and a class AB class AB power amplifier (PA) 106. The enhanced pulse frequency modulation (PFM) variable supply rail generator 104 may supply both a positive variable supply rail 122 and a negative variable supply rail 124 to a class AB power amplifier (PA) 106.

For a class AB power amplifier (PA) 106 used in MP3 playback, a low standby current and 0.1 milliwatts (mW) of playback current are required. Traditionally, the regulators 194 (e.g., a buck regulator and a flyback regulator) use pulse frequency modulation (PFM) mode under light load conditions and switch to pulse width modulation (PWM) mode for heavy loads. However, using multiple control modes may result in more analog circuits being designed to support each of the control modes. These analog circuits may consume chip area. Furthermore, transitions between different control modes may be problematic due to the initial conditions of the control states. During transitions, glitches at the output of the regulators 194 may be produced. Also, a conventional pulse frequency modulation (PFM) mode may control an inductor current between 0 and a peak current value (IP_PFM), thereby limiting the maximum load current to IP_PFM/2.

The enhanced pulse frequency modulation (PFM) variable supply rail generator 104 may allow for a unified control approach for regulators 194 within the enhanced pulse frequency modulation (PFM) variable supply rail generator 104. The regulators 194 may include a buck regulator and a flyback regulator. The enhanced pulse frequency modulation (PFM) variable supply rail generator 104 may allow for the generation of positive and negative variable supply envelope rail voltages for the class AB power amplifier (PA) 106 to be generated in advance. By using enhanced pulse frequency modulation (PFM) mode for controlling the regulators 194, both the power efficiency and the die space used by the class-H power amplifier 102 may be reduced. The enhanced pulse frequency modulation (PFM) mode for controller the regulators 194 allows for a precisely controlled inductor current, which in turn allows for using a small size inductor that saturates at smaller current levels. For example, enhanced pulse frequency modulation (PFM) mode may allow for an 0402 size inductor to be used instead of an 0603 size inductor, due to the tight control of the inductor current. Using an 0402 size inductor instead of an 0603 size inductor may save board space and the component height may be reduced by 0.3 millimeters (mm). Also, using an 0402 size inductor instead of an 0603 size inductor may reduce the cost of the bill of materials (BOM) of the class-H power amplifier 102.

By using enhanced pulse frequency modulation (PFM) mode for controlling the regulators 194, analog design may be simplified and chip area may be reduced (since pulse width modulation (PWM) mode is eliminated). Enhanced pulse frequency modulation (PFM) mode may result in a significant reduction of die area. Furthermore, enhanced pulse frequency modulation (PFM) mode may reduce reference tracking delay (compared to pulse width modulation (PWM) control). This may result in a 12.4% efficiency improvement at 20 kilohertz (kHz) and a 1.3% efficiency improvement at 1 kHz. The efficiency improvement may vary depending on the statistics of the input signal 110. Reducing the reference tracking delay may also reduce the digital look-ahead buffer area and power. In one configuration, reducing the reference tracking delay may reduce the digital look-ahead buffer area and power by 13%.

The enhanced pulse frequency modulation (PFM) variable supply rail generator 104 may include an estimated load current 112 for the regulators 194, the power amplifier (PA) output signal amplitude 116 and the load resistance 118. The load resistance 118 may an input variable from software. The load resistance 118 may be a fixed value or an adaptive value from an impedance detection module. The load current 112 of the regulators 194 may be estimated based on the known values of the power amplifier (PA) output signal amplitude 116 and the load resistance 118. In one configuration, the enhanced pulse frequency modulation (PFM) variable supply rail generator 104 may directly determine the power amplifier (PA) output signal amplitude 116 from the input signal 110 and an input parameter 108 (along with the gain of the class AB amplifier, if any). The enhanced pulse frequency modulation (PFM) variable supply rail generator 104 may also receive an input signal 110 (that is to be amplified by the class AB power amplifier (PA) 106).

The enhanced pulse frequency modulation (PFM) variable supply rail generator 104 may provide a positive variable supply rail 122 with a positive load current 120a to the class AB power amplifier (PA) 106. The enhanced pulse frequency modulation (PFM) variable supply rail generator 104 may also provide a negative variable supply rail 124 with a negative load current 120b to the class AB power amplifier (PA) 106. In one configuration, the positive variable supply rail 122 may be provided by a buck regulator and the negative variable supply rail 124 may be provided by a negative charge pump (NCP). In another configuration, the positive variable supply rail 122 may be provided by a buck regulator and the negative variable supply rail 124 may be provided by a flyback regulator. The class AB power amplifier (PA) 106 may generate an output signal 126.

Figure 2:
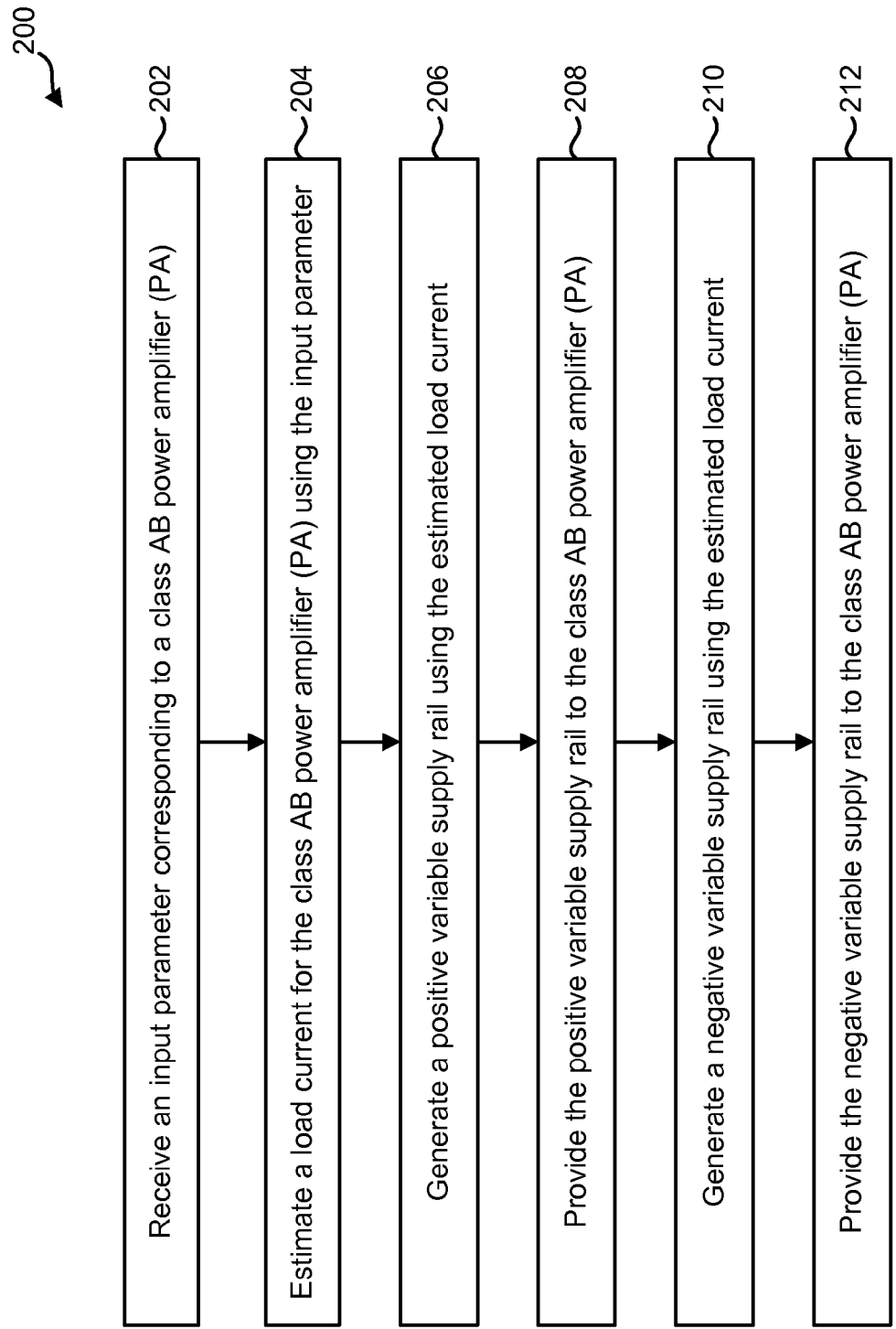
FIG. 2 is a method for using an enhanced pulse frequency modulation (PFM) control mode for a class AB power amplifier (PA) to obtain a class-H amplifier.

FIG. 2 is a method 200 for using an enhanced pulse frequency modulation (PFM) control mode for a class AB power amplifier (PA) 106 to obtain a class-H amplifier 102. The method 200 may be performed by an electronic device. For example, the electronic device may be a base station or a wireless communication device. The electronic device may include an enhanced pulse frequency modulation (PFM) control mode amplifier 102. The method 200 may use an enhanced pulse frequency modulation (PFM) control mode. The class-H power amplifier 102 may include an enhanced pulse frequency modulation (PFM) variable supply rail generator 104 and a class AB power amplifier (PA) 106. In one configuration, the method 200 may be performed by the enhanced pulse frequency modulation (PFM) variable supply rail generator 104.

The enhanced pulse frequency modulation (PFM) variable supply rail generator 104 may receive 202 an input parameter 108 corresponding to the class AB power amplifier (PA) 106. In one configuration, the input parameter 108 may include the power amplifier (PA) output signal amplitude 116 and the load resistance 118 of the class AB power amplifier (PA) 106. The enhanced pulse frequency modulation (PFM) variable supply rail generator 104 may estimate 204 a load current 112 for the class AB power amplifier (PA) 106. The enhanced pulse frequency modulation (PFM) variable supply rail generator 104 may generate 206 a positive variable supply rail 122 using the estimated load current 112. In one configuration, the enhanced pulse frequency modulation (PFM) variable supply rail generator 104 may use a buck regulator to generate the positive variable supply rail 122. The enhanced pulse frequency modulation (PFM) variable supply rail generator 104 may provide 208 the positive variable supply rail 122 to the class AB power amplifier (PA) 106.

The enhanced pulse frequency modulation (PFM) variable supply rail generator 104 may also generate 210 a negative variable supply rail 124 using the estimated load current 112. In one configuration, the enhanced pulse frequency modulation (PFM) variable supply rail generator 104 may use a negative charge pump (NCP) to generate 210 the negative variable supply rail 124. In another configuration, the enhanced pulse frequency modulation (PFM) variable supply rail generator 104 may use a flyback converter to generate 210 the negative variable supply rail 124. The enhanced pulse frequency modulation (PFM) variable supply rail generator 104 may provide 212 the negative variable supply rail 124 to the class AB power amplifier (PA) 106.

Figure 3:
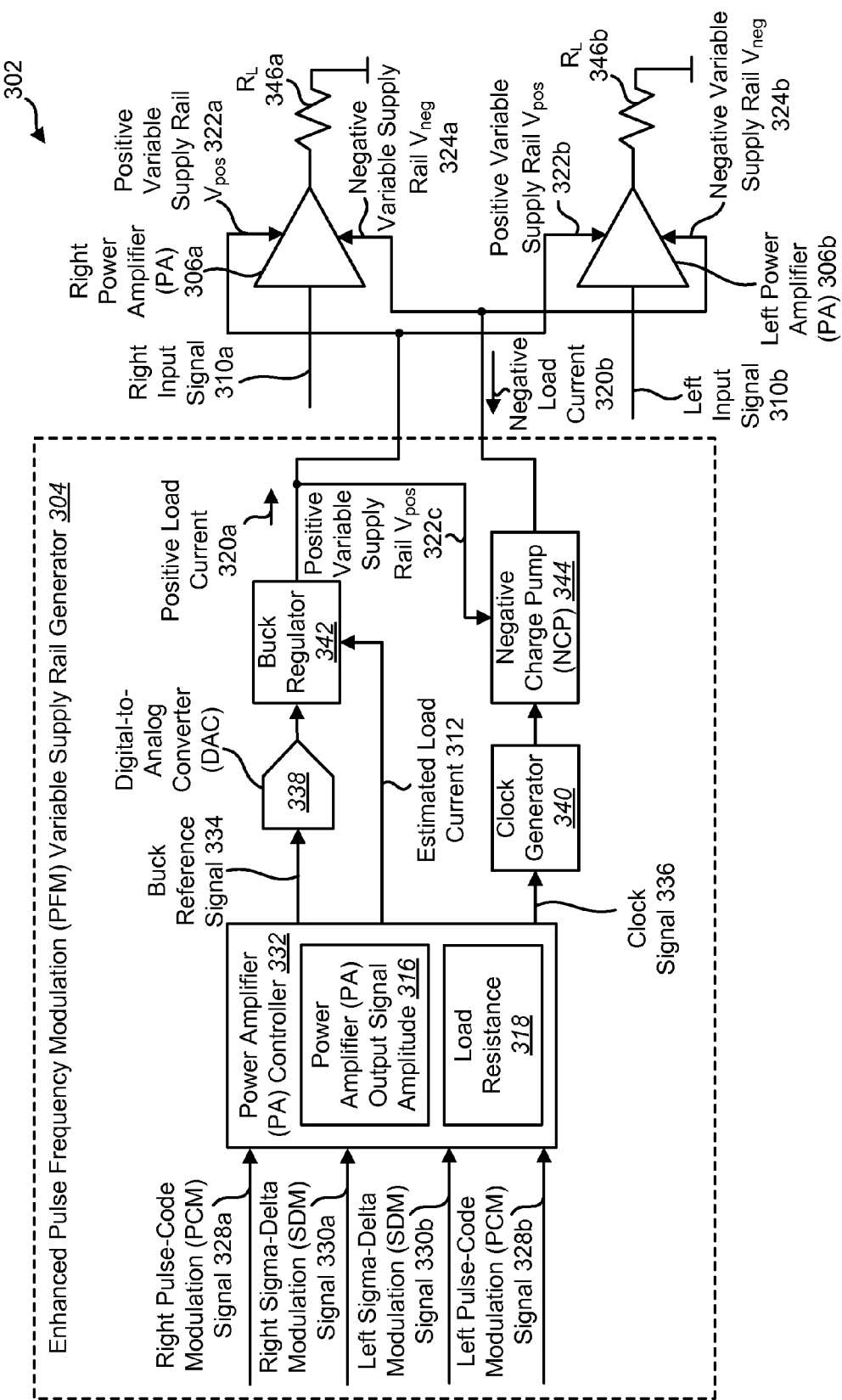
FIG. 3 is a block diagram illustrating an enhanced pulse frequency modulation (PFM) variable supply rail generator in a class-H power amplifier (PA)

FIG. 3 is a block diagram illustrating an enhanced pulse frequency modulation (PFM) variable supply rail generator 304 in a class-H power amplifier (PA) 302. Enhanced pulse frequency modulation (PFM) mode may be used for a buck regulator 342. The enhanced pulse frequency modulation (PFM) variable supply rail generator 304 may provide a positive variable supply rail Vpos 322a to a right power amplifier (PA) 306a and a positive variable supply rail Vpos 322b to a left power amplifier (PA) 306b. The enhanced pulse frequency modulation (PFM) variable supply rail generator 304 may also provide a negative variable supply rail Vneg 324a to the right power amplifier (PA) 306a and a negative variable supply rail Vneg 324b the left power amplifier (PA) 306b.

The enhanced pulse frequency modulation (PFM) variable supply rail generator 304 may use an enhanced pulse frequency modulation (PFM) control mode. In the enhanced pulse frequency modulation (PFM) control mode, the enhanced pulse frequency modulation (PFM) variable supply rail generator 304 may use prior knowledge of the power amplifiers (PAs) 306a-b to pre-generate supply rails, increasing the efficiency of the enhanced pulse frequency modulation (PFM) variable supply rail generator 304. The enhanced pulse frequency modulation (PFM) variable supply rail generator 304 may include a power amplifier (PA) controller 332, a buck regulator 342 and a negative charge pump (NCP) 344. The power amplifier (PA) controller 332 may receive a right pulse-code modulation (PCM) signal 328a, a right sigma-delta modulation (SDM) signal 330a, a left pulse-code modulation (PCM) signal 328b and a left sigma-delta modulation (SDM) signal 330b from the input signal 110.

The power amplifier (PA) controller 332 may include the power amplifier (PA) output signal amplitude 316 and the load resistance 318. Based on the power amplifier (PA) output signal amplitude 316 and the load resistance 318, the power amplifier (PA) controller 332 may determine an estimated load current (I_est[4:0]) 312 of the buck regulator 342. The power amplifier (PA) controller 332 may provide the estimated load current 312 to the buck regulator 342.

The estimated load current 312 of the buck regulator 342 may have two parts: a power amplifier (PA) current Ipa that is proportional to the output signal voltage and a filter capacitor current Icf that is required to charge the capacitors at the output of the buck regulator 342. The capacitors at the output of the buck regulator 342 are discussed in additional detail in relation to FIG. 5. The power amplifier (PA) current Ipa may be estimated based on the input voltage of the power amplifier (PA) 306, the load resistance 318 of the power amplifier (PA) 306 and the tolerance of the power amplifier (PA) 306 (it is assumed that the power amplifier (PA) 306 has a tolerance of 30%). Thus, the power amplifier (PA) current Ipa may be calculated using Equation (1):

$$Ipa = \left(\frac{|Vin\_right|}{R_L} + \frac{|Vin\_left|}{R_L}\right) * 1.3. \quad (1)$$

In Equation (1), Vin_right is the input voltage for the right power amplifier (PA) 306a, Vin_left is the input voltage for the left power amplifier (PA) 306b and $R_L$ is the load resistance 118.

The filter capacitor current Icf may be determined from the rate of change of the envelope. For example, the filter capacitor current Icf may be calculated using Equation (2):

$$Icf = Ctotal \frac{d}{dt}(buck\_ref). \quad (2)$$

In Equation (2), Ctotal is the total capacitance of the filter capacitor. The estimated load current I_est[4:0] 312 may then be found using Equation (3):

$$I\_est[4:0] = quantized(Ipa + Icf). \quad (3)$$

Due to prior knowledge of the signal in the digital signal chain, the power amplifier (PA) controller 332 may generate a buck reference signal (buck_ref[4:0]) 334 for the buck regulator 342 in advance. The power amplifier (PA) controller 332 may provide the buck reference signal 334 to the buck regulator 342 via a digital-to-analog converter (DAC) 338. The power amplifier (PA) controller 332 may also generate a variable frequency clock signal (cp_fclk[3:0]) 336 that optimizes the power efficiency of the negative charge pump (NCP) 344. The variable frequency clock signal 336 may be provided to the negative charge pump (NCP) 344 via a clock generator 340.

The buck regulator 342 may generate a positive variable supply rail Vpos 322a for the right power amplifier (PA) 306a and a positive variable supply rail Vpos 322b for the left power amplifier (PA) 306b. The buck regulator 342 may also provide a positive variable supply rail Vpos 322c to the negative charge pump (NCP) 344. The positive variable supply rail Vpos 322 generated by the buck regulator 342 may have a positive load current 320a. The negative charge pump (NCP) 344 may use the positive variable supply rail Vpos 322c to generate a negative variable supply rail Vneg 324a for the right power amplifier (PA) 306a and a negative variable supply rail Vneg 324b for the left power amplifier (PA) 306b. The negative variable supply rail Vneg 324 generated by the negative charge pump (NCP) 344 may have a negative load current 320b.

The buck regulator 342 may operate exclusively in pulse frequency modulation (PFM) control mode with little or no efficiency degradation in a high current range. The buck regulator 342 may use fast tracking with a feed forward capacitor current.

The right power amplifier (PA) 306a may receive a right input signal 310a. The right power amplifier (PA) 306a may generate a right output signal that is provided to a load RL 346a. The left power amplifier (PA) 306b may receive a left input signal 310b. The left power amplifier (PA) 306b may generate a left output signal that is provided to a load RL 346b.

Figure 4:
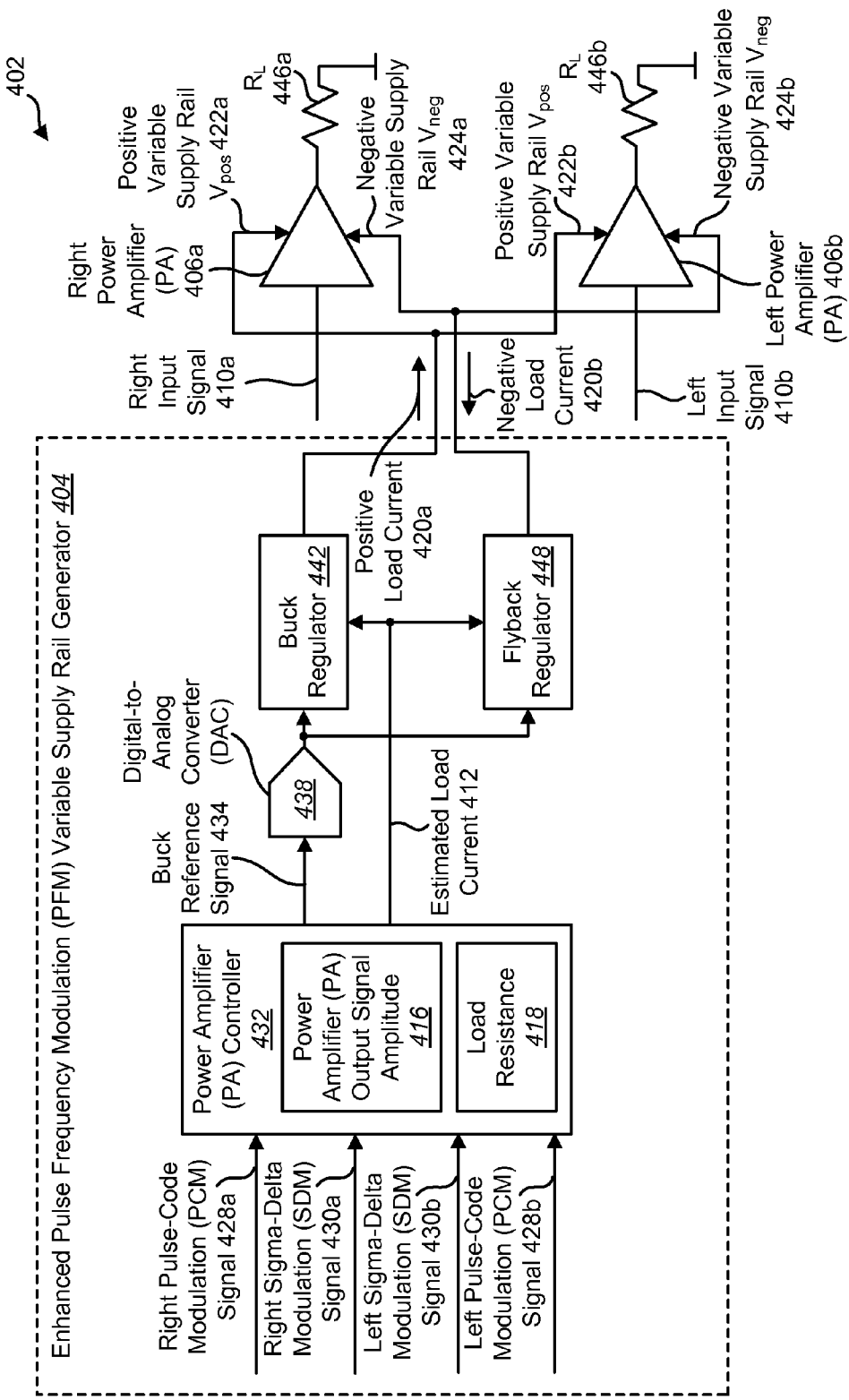
FIG. 4 is a block diagram illustrating a variable supply rail generator, a right power amplifier (PA) and a left power amplifier (PA) in another enhanced pulse frequency modulation (PFM) control mode amplifier.

FIG. 4 is a block diagram illustrating another enhanced pulse frequency modulation (PFM) variable supply rail generator 404 in a class-H power amplifier (PA) 402. Enhanced pulse frequency modulation (PFM) mode may be used for both a buck regulator 442 and a flyback regulator 448. The enhanced pulse frequency modulation (PFM) variable supply rail generator 404 may provide a positive variable supply rail Vpos 422a to the right power amplifier (PA) 406a and a positive variable supply rail Vpos 422b to the left power amplifier (PA) 406b. The enhanced pulse frequency modulation (PFM) variable supply rail generator 404 may also provide a negative variable supply rail Vneg 424a to the right power amplifier (PA) 406a and a negative variable supply rail Vneg 424b the left power amplifier (PA) 406b.

The filter capacitor current Icf may be calculated using Equation (4):

$$Icf = (Cfly + Chold)\frac{d}{dt}(F_{IIR}(\text{buck\_ref})) + Cbuck\frac{d}{dt}(\text{buck\_ref}). \quad (4)$$

In Equation (4), the function $F_{IIR}$ is used to mimic the transfer function of the negative charge pump (NCP) 344. The function $F_{IIR}$ is an infinite impulse response filter.

The enhanced pulse frequency modulation (PFM) variable supply rail generator 404 may use an enhanced pulse frequency modulation (PFM) control mode. The enhanced pulse frequency modulation (PFM) variable supply rail generator 404 may include a power amplifier (PA) controller 432, a buck regulator 442 and a flyback regulator 448. The power amplifier (PA) controller 432 may receive a right pulse-code modulation (PCM) signal 428a, a right sigma-delta modulation (SDM) signal 430a, a left pulse-code modulation (PCM) signal 428b and a left sigma-delta modulation (SDM) signal 430b. The power amplifier (PA) controller 432 may include the power amplifier (PA) output signal amplitude 416 and the load resistance 418. Based on the power amplifier (PA) output signal amplitude 416 and the load resistance 418, the power amplifier (PA) controller 432 may determine an estimated load current (I_est[4:0]) 412 of the buck regulator 442 and the flyback regulator 448. The power amplifier (PA) controller 432 may provide the estimated load current 412 to the buck regulator 442 and to the flyback regulator 448.

Due to prior knowledge of the signal in the digital signal chain, the power amplifier (PA) controller 432 may generate a buck reference signal (buck_ref[4:0]) 434 for the buck regulator 442 in advance. The power amplifier (PA) controller 432 may provide the buck reference signal 434 to the buck regulator 442 via a digital-to-analog converter (DAC) 438. The power amplifier (PA) controller 432 may also provide the buck reference signal 434 to the flyback regulator 448 via the digital-to-analog converter (DAC) 438.

The buck regulator 442 may generate a positive variable supply rail Vpos 422a for the right power amplifier (PA) 406a and a positive variable supply rail Vpos 422b for the left power amplifier (PA) 406b. The positive variable supply rail Vpos 422 may have a positive load current 420a. The flyback regulator 448 may generate a negative variable supply rail Vneg 424a for the right power amplifier (PA) 406a and a negative variable supply rail Vneg 424b for the left power amplifier (PA) 406b. The negative variable supply rail Vneg 424 generated by the flyback regulator 448 may have a negative load current 420b.

The flyback regulator 448 may operate exclusively in pulse frequency modulation (PFM) control mode with some efficiency degradation in a high current range. The efficiency in the high current range may still be higher than at 0.1 mW output. Due to the nature of a music signal, the probability of a high current is small. So, some efficiency can be sacrificed without significant impact on playing time.

The right power amplifier (PA) 406a may receive a right input signal 410a. The right power amplifier (PA) 406a may generate a right output signal that is provided to a load RL 446a. The left power amplifier (PA) 406b may receive a left input signal 410b. The left power amplifier (PA) 406b may generate a left output signal that is provided to a load RL 446b.

Figure 5:
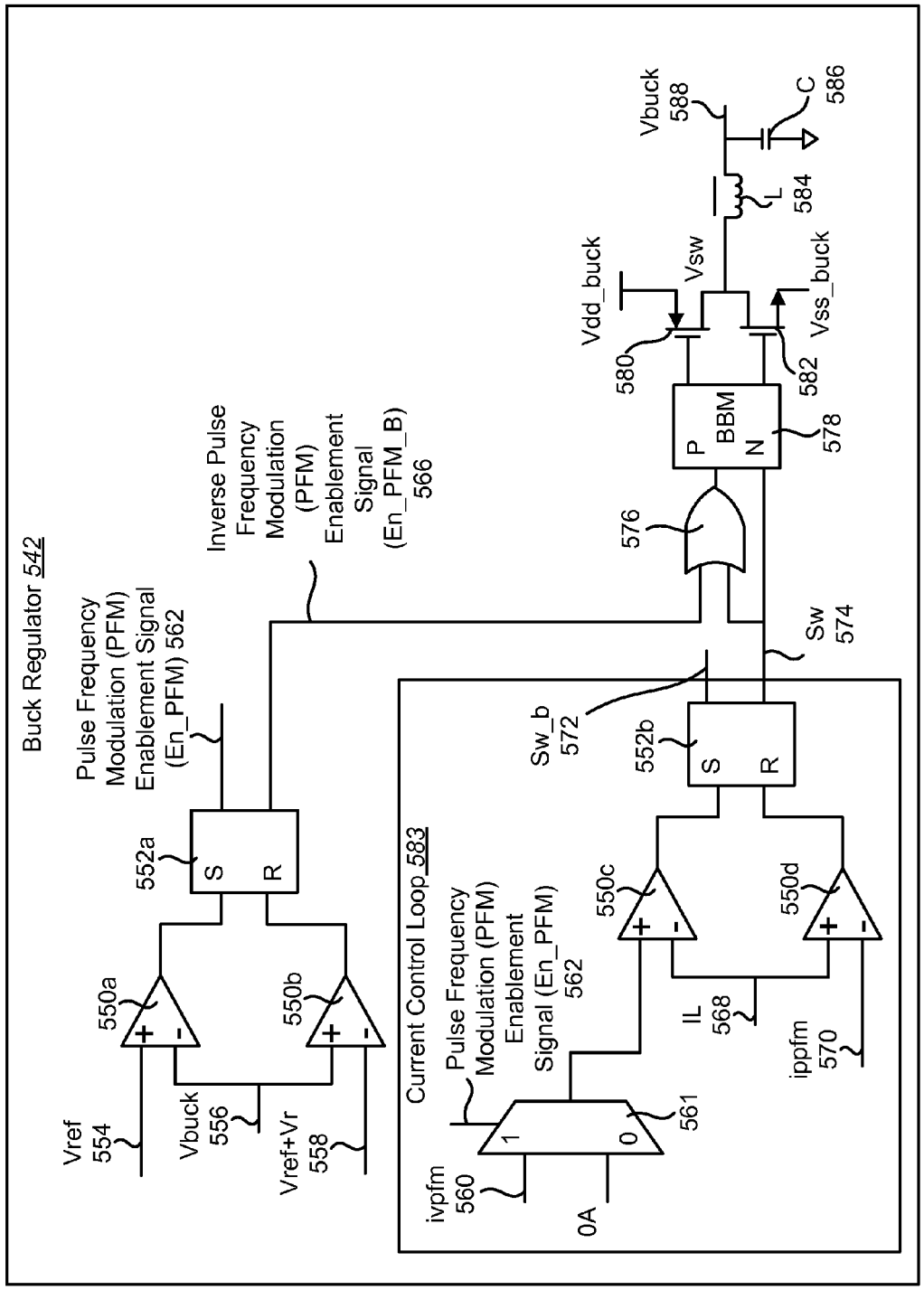
FIG. 5 is a block diagram illustrating a buck regulator for use in the present systems and methods.

FIG. 5 is a block diagram illustrating a buck regulator 542 for use in the present systems and methods. The buck regulator 542 of FIG. 5 may be one configuration of the buck regulator 142 of FIG. 1. In the buck regulator 542, load current dependent peak/valley current boundaries in pulse frequency modulation (PFM) mode are obtained. The buck regulator 542 may include multiple comparators 550a-d, multiple SR latches 552a-b, an OR gate 576 and a positive/negative (PN) Break Before Make (BBM) 578.

A first comparator 550a may receive a Vref signal 554 on the positive input and a Vbuck signal 556 on the negative input. The output of the first comparator 550a may be coupled to the set (S) input of a first SR latch 552a. A second comparator 550b may receive the Vbuck signal 556 on the positive input and a Vref+Vr signal 558 on the negative input. The output of the second comparator 550b may be coupled to the reset (R) input of the first SR latch 552a. The first SR latch 552a may output a pulse frequency modulation (PFM) enablement signal (En_PFM) 562 and an inverse pulse frequency modulation (PFM) enablement signal (En_PFM_B) 566. The inverse pulse frequency modulation (PFM) enablement signal (En_PFM_B) 566 may be provided to the OR gate 576.

A pulse frequency modulation (PFM) enablement signal (En_PFM) 562 may control a multiplexer 561 that receives a current signal ivpfm 560 and a current signal of 0 amps. If the pulse frequency modulation (PFM) enablement signal (En_PFM) 562 is high, the multiplexer 561 may output the current signal ivpfm 560. If the pulse frequency modulation (PFM) enablement signal (En_PFM) 562 is low, the multiplexer 561 may output the current signal of 0 amps.

The output of the multiplexer 561 may be coupled to a positive input of a third comparator 550c. The negative input of the third comparator 550c may receive an IL signal 568. The output of the third comparator 550c may be coupled to the set (S) input of a second SR latch 552b. A positive input of a fourth comparator 550d may receive the IL signal 568. The negative input of the fourth comparator 550d may receive the current signal ippfm 570. The output of the fourth comparator 550d may be coupled to the reset (R) input of the second SR latch 552b. The third comparator 550c and the fourth comparator 550d are the current control comparators. The current control comparators along with the second SR latch 552b may be referred to as the current control loop 583.

The second SR latch 552b may output an Sw signal 574 and an Sw_b signal 572. The Sw signal 574 may be provided to the N input of the Break Before Make (BBM) 578 and to the OR gate 576. The output of the OR gate 576 may be coupled to the P input of the Break Before Make (BBM) 578.

The first output of the Break Before Make (BBM) 578 may be coupled to the gate of a P-channel transistor 580. The second output of the Break Before Make (BBM) 578 may be coupled to the gate of an N-channel transistor 582. The source of the P-channel transistor 580 may be coupled to a rail voltage Vdd_buck. The drain of the P-channel transistor 580 may be coupled to the drain of the N-channel transistor 582. The source of the N-channel transistor 582 may be coupled to a rail voltage Vss_buck. The drain of the P-channel transistor 580 may also be coupled to an inductor L 584 (the line across the top of the inductor indicates the inductor's core). A capacitor C 586 may be coupled between the inductor L 584 and ground. The buck regulator 542 may output a signal Vbuck 588.

In the buck regulator 542, feedforward current control may be used. This may allow the buck regulator 542 to switch between ivpfm 560 and ippfm 570. Both ivpfm 560 and ippfm 570 are illustrated as functions of time in FIG. 6. The current ivpfm 560 may be equal to the maximum of (0, iload*1.3−ΔIL/2). The current ippfm 570 may be equal to the maximum of (IP_thres, iload*1.3+ΔIL/2). The current ΔIL may be optimized based on switching and conduction losses.

For enhanced pulse frequency modulation (PFM) operation, if Vbuck 556 is greater than Vref 554, the P-channel transistor 580 may be turned on. The P-channel transistor 580 may be turned off when the current IL 568 reaches a peak current ippfm 570. When the current IL 568 reaches the peak current ippfm 570, the N-channel transistor 582 is turned on to bring the current IL 568 up to a valley current ivpfm 560. When the current IL 568 reaches zero, the P-channel transistor 580 is turned on and the N-channel transistor 582 is turned off. This process may be repeated until Vbuck 556 reaches Vref+Vr 558. When Vbuck 556 reaches Vref+Vr 558, both the P-channel transistor 580 and the N-channel transistor 582 are turned off.

Figure 6:
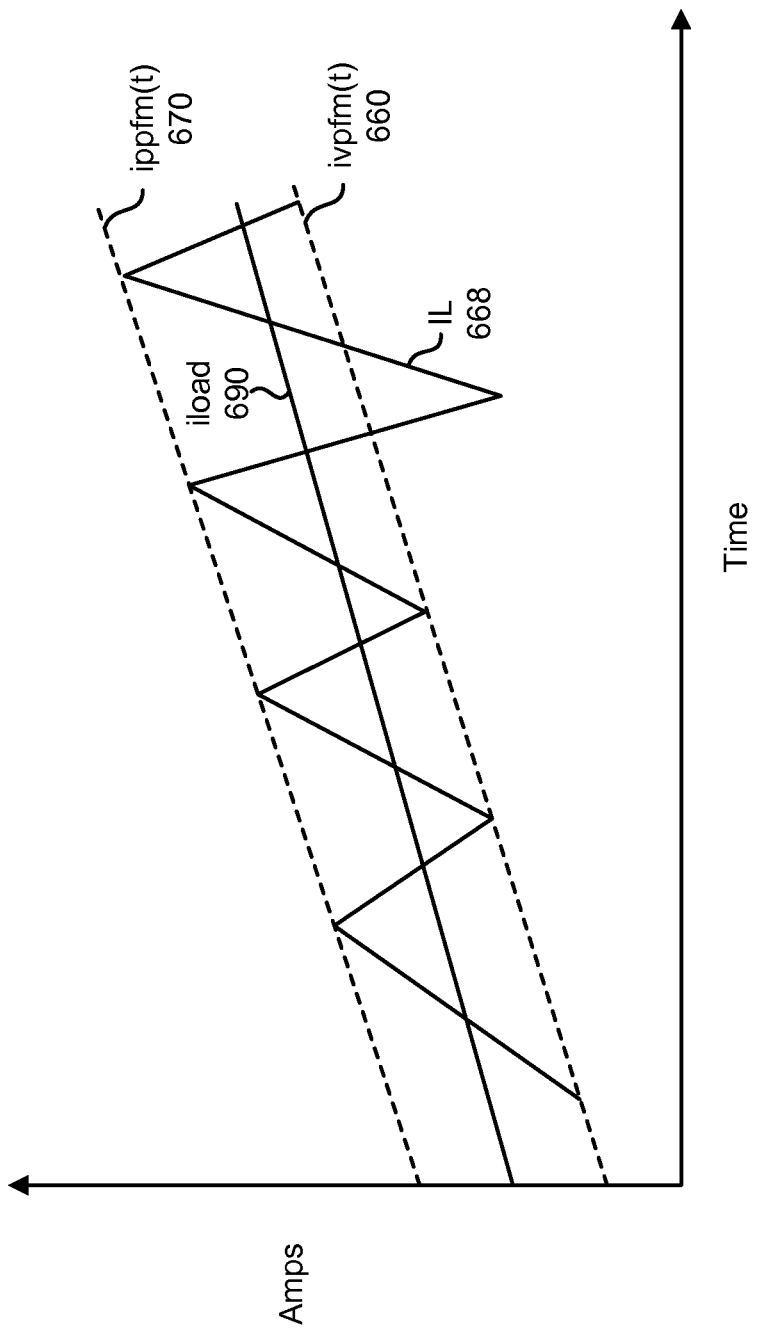
FIG. 6 is a graph illustrating current control in a buck regulator.

FIG. 6 is a graph illustrating current control in a buck regulator 342. A plot for the peak current signal ippfm(t) 670 and a plot for the valley current signal ivpfm(t) 660 are shown. A plot for the current iload 690 and the current IL 668 are also shown. The current iload 690 is the actual load current (which may be slightly different from the estimated load current 112 due to component tolerances).

Figure 7:
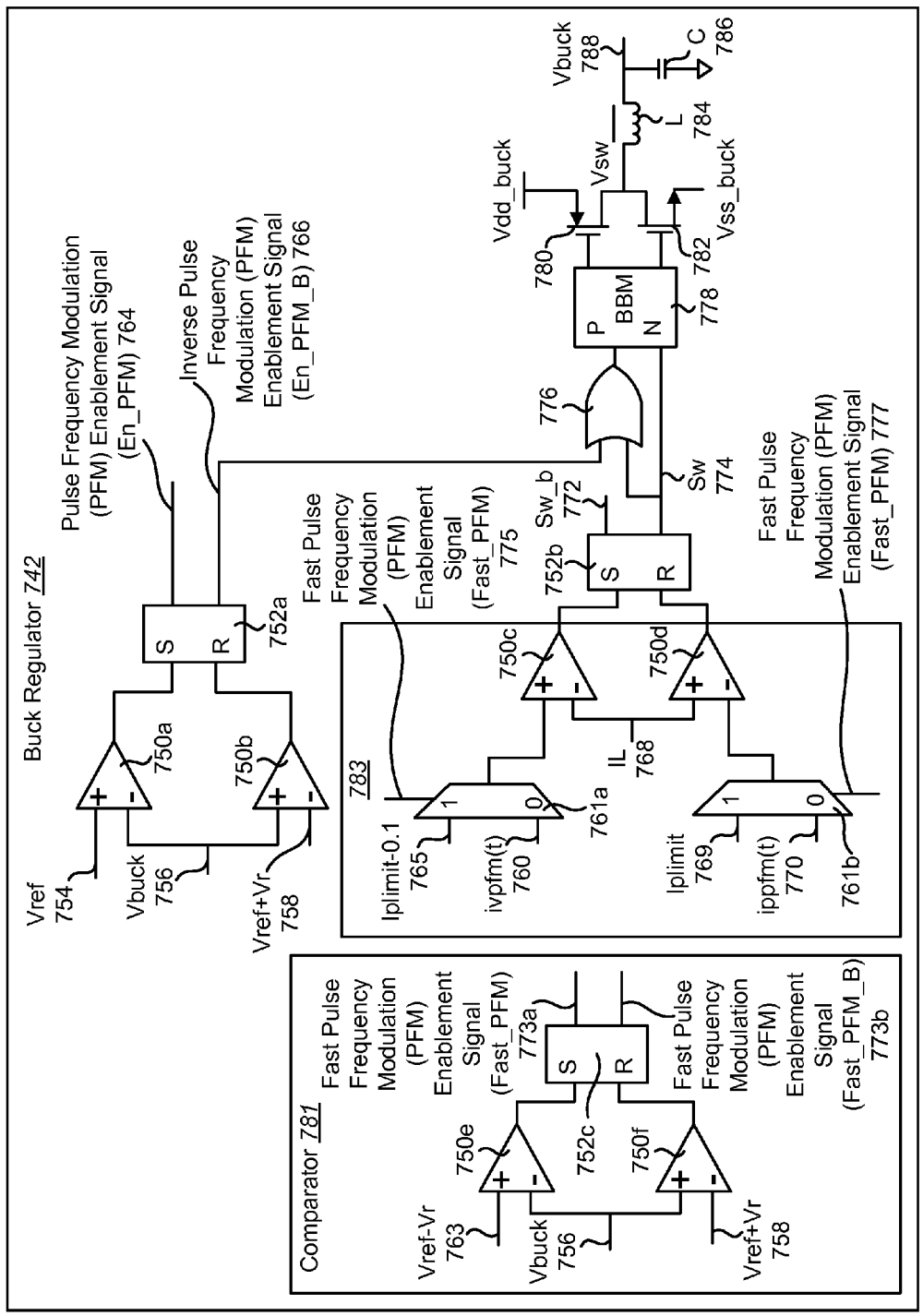
FIG. 7 is a block diagram illustrating another buck regulator for use in the present systems and methods.

FIG. 7 is a block diagram illustrating another buck regulator 742 for use in the present systems and methods. The buck regulator 742 of FIG. 7 may be one configuration of the buck regulator 342 of FIG. 3. In the buck regulator 742, current boundaries may be set around a current limit when an output voltage Vout drops below a reference voltage Vref. The buck regulator 742 may include multiple comparators 750a-f, multiple SR latches 752a-c, an OR gate 776, multiple multiplexers 761a-b and a positive/negative (PN) Break Before Make (BBM) 778. The buck regulator 742 may include a comparator block 781 and current control comparators 783. The outputs of the comparator block 781 may be used to control the multiplexers 761a-b in the current control comparators 783 (e.g., the fast pulse frequency modulation (PFM) enablement signal (Fast_PFM) 773a may be the fast pulse frequency modulation (PFM) enablement signal (Fast_PFM) 775). The buck regulator 742 may utilize fast pulse frequency modulation (PFM) mode.

A first comparator 550a may receive a Vref signal 754 on the positive input and a Vbuck signal 756 on the negative input. The output of the first comparator 550a may be coupled to the set (S) input of a first SR latch 752a. A second comparator 550b may receive the Vbuck signal 756 on the positive input and a Vref+Vr signal 758 on the negative input. The output of the second comparator 550b may be coupled to the reset (R) input of the first SR latch 752a. The first SR latch 752a may output a pulse frequency modulation (PFM) enablement signal (En_PFM) 764 and an inverse pulse frequency modulation (PFM) enablement signal (En_PFM_B) 766. The inverse pulse frequency modulation (PFM) enablement signal (En_PFM_B) 766 may be provided to the OR gate 776.

A fast pulse frequency modulation (PFM) enablement signal (Fast_PFM) 775 may control a first multiplexer 761a that receives a current signal Iplimit−0.1 765 and a current signal ivpfm(t) 760. If the fast pulse frequency modulation (PFM) enablement signal (Fast_PFM) 775 is high, the first multiplexer 761a may output the current signal Iplimit−0.1 765. If the fast pulse frequency modulation (PFM) enablement signal (Fast_PFM) 775 is low, the first multiplexer 761a may output the current signal ivpfm(t) 760.

The output of the first multiplexer 761a may be coupled to a positive input of a third comparator 550c. The negative input of the third comparator 550c may receive a signal IL 768. The output of the third comparator 550c may be coupled to the set (S) input of a second SR latch 752b. A positive input of a fourth comparator 550d may also receive the signal IL 768. The negative input of the fourth comparator 550d may receive the output of a second multiplexer 761b.

The second multiplexer 761b may receive a current signal iplimit 769 and a current signal ippfm(t) 770. The second multiplexer 761b may be controlled by a fast pulse frequency modulation (PFM) enablement signal (Fast_PFM) 777. If the fast pulse frequency modulation (PFM) enablement signal (Fast_PFM) 777 is high, the second multiplexer 761b may output the current signal iplimit 769. If the fast pulse frequency modulation (PFM) enablement signal (Fast_PFM) 777 is low, the second multiplexer 761b may output the current signal ippfm(t) 770.

The output of the fourth comparator 550d may be coupled to the reset (R) input of the second SR latch 752b. The second SR latch 752b may output an Sw signal 774 and an Sw_B signal 772. The Sw signal 774 may be provided to the N input of the Break Before Make (BBM) 778 and to the OR gate 776. The output of the OR gate 776 may be coupled to the P input of the Break Before Make (BBM) 778.

The first output of the Break Before Make (BBM) 778 may be coupled to the gate of a P-channel transistor 780. The second output of the Break Before Make (BBM) 778 may be coupled to the gate of an N-channel transistor 782. The source of the P-channel transistor 780 may be coupled to a rail voltage Vdd_buck. The drain of the P-channel transistor 780 may be coupled to the drain of the N-channel transistor 782. The source of the N-channel transistor 782 may be coupled to a rail voltage Vss_buck. The drain of the P-channel transistor 780 may also be coupled to an inductor L 784. A capacitor C 786 may be coupled between the inductor L 784 and ground. The buck regulator 742 may output a signal Vbuck 788.

The buck regulator 742 may include a comparator 781. The comparator 781 may include a fifth comparator 550e, a sixth comparator 550f and a third SR latch 752c. The fifth comparator 550e may receive a Vref−Vr signal 763 on the positive input and a Vbuck signal 756 on the negative input. The output of the fifth comparator 550e may be coupled to the set (S) input of the third SR latch 752c. The sixth comparator 550f may receive the Vbuck signal 756 on the positive input and a Vref+Vr signal 758 on the negative input. The output of the sixth comparator 550f may be coupled to the reset (R) input of the third SR latch 752c. The third SR latch 752c may output a fast pulse frequency modulation (PFM) enablement signal (Fast_PFM) 773a and an inverse fast pulse frequency modulation (PFM) enablement signal (Fast_PFM_B) 773b.

For enhanced pulse frequency modulation (PFM) operation, if Vbuck 756 is greater than Vref 754, the P-channel transistor 780 may be turned on. The P-channel transistor 780 may be turned off when the current IL 768 reaches a peak current ippfm(t) 770. When the current IL 768 reaches the peak current ippfm(t) 770, the N-channel transistor 782 is turned on to bring the current IL 768 up to a valley current ivpfm(t) 760. When the current IL 768 reaches zero, the P-channel transistor 780 is turned on and the N-channel transistor 782 is turned off. This process may be repeated until Vbuck 756 reaches Vref+Vr 758. When Vbuck 756 reaches Vref+Vr 758, both the P-channel transistor 780 and the N-channel transistor 782 are turned off.

Figure 8:
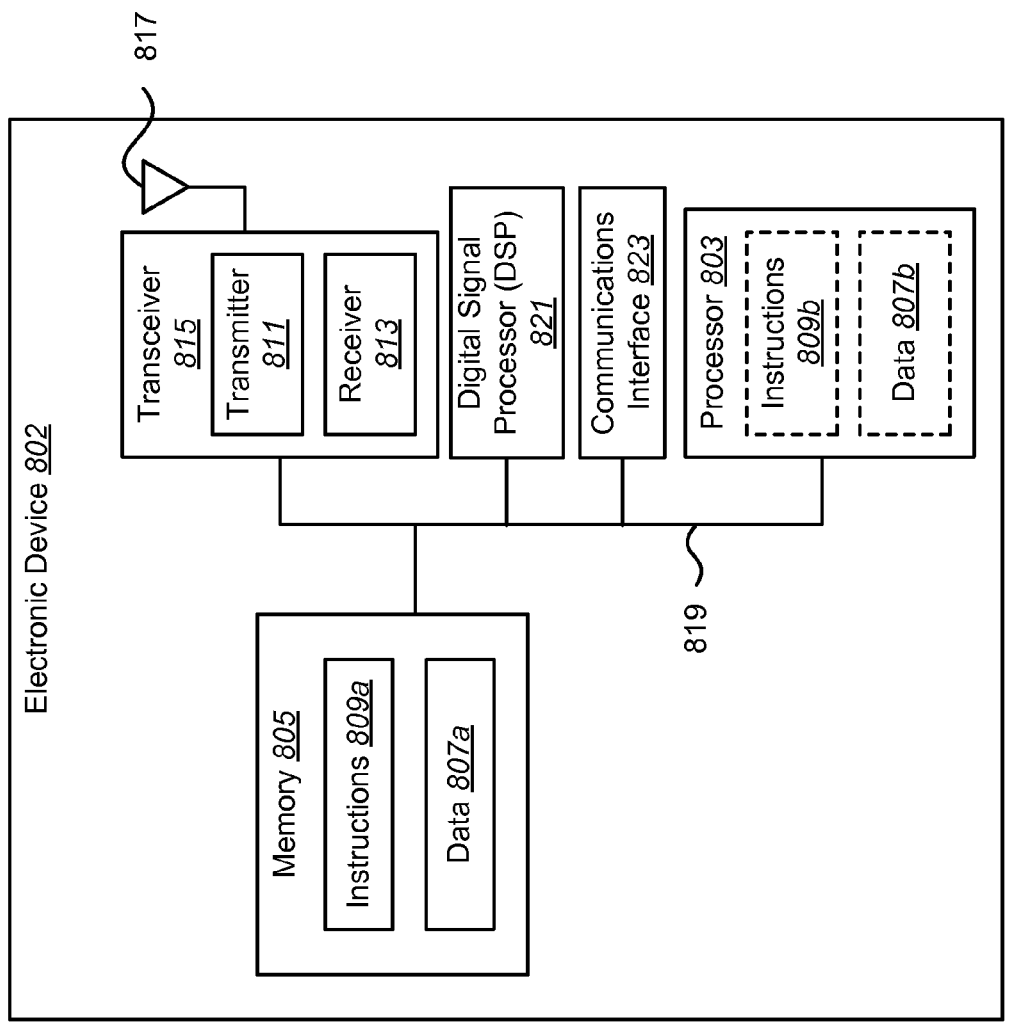
FIG. 8 illustrates certain components that may be included within an electronic device.

FIG. 8 illustrates certain components that may be included within an exemplary electronic device 802. The electronic device 802 may be a base station, an access point, a NodeB, an evolved NodeB, a wireless communication device, a user equipment (UE), an access terminal or any other electronic device with digital signals. The electronic device 802 includes a processor 803. The processor 803 may be a general purpose single- or multi-chip microprocessor (e.g., an ARM), a special purpose microprocessor (e.g., a digital signal processor (DSP)), a microcontroller, a programmable gate array, etc. The processor 803 may be referred to as a central processing unit (CPU). Although just a single processor 803 is shown in the electronic device 802 of FIG. 8, in an alternative configuration, a combination of processors (e.g., an ARM and DSP) could be used.

The exemplary electronic device 802 also includes memory 805. The memory 805 may be any electronic component capable of storing electronic information. The memory 805 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 807a and instructions 809a may be stored in the memory 805. The instructions 809a may be executable by the processor 803 to implement the methods disclosed herein. Executing the instructions 809a may involve the use of the data 807a that is stored in the memory 805. When the processor 803 executes the instructions 809a, various portions of the instructions 809b may be loaded onto the processor 803, and various pieces of data 807b may be loaded onto the processor 803.

The exemplary electronic device 802 may also include a transmitter 811 and a receiver 813 to allow transmission and reception of signals to and from the electronic device 802 using an antenna 817. The transmitter 811 and receiver 813 may be collectively referred to as a transceiver 815. The exemplary electronic device 802 may also include (not shown) multiple transmitters, multiple receivers and/or multiple transceivers. The exemplary electronic device 802 may also include a digital signal processor (DSP) 821 and a communications interface 823.

The various components of the exemplary electronics device 802 may be coupled together by one or more buses, which may include a power bus, a control signal bus, a status signal bus, a data bus, etc. For the sake of clarity, the various buses are illustrated in FIG. 8 as a bus system 819.

Those of skill in the art would understand that information and signals may be represented using any of a variety of different technologies and techniques. For example, data, instructions, commands, information, signals, bits, symbols and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits and algorithm steps described in connection with the embodiments disclosed herein may be implemented as electronic hardware, computer software or combinations of both. To clearly illustrate this interchangeability of hardware and software, various illustrative components, blocks, modules, circuits and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read-Only Memory (ROM), Electrically Programmable ROM (EPROM), Electrically Erasable Programmable ROM (EEPROM), registers, hard disk, a removable disk, a CD-ROM or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware or any combination thereof. If implemented in software, the functions may be stored on or transmitted over as one or more instructions or code on a computer-readable medium.

Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server or other remote source using a coaxial cable, fiber optic cable, twisted pair, digital subscriber line (DSL) or wireless technologies such as infrared, radio and microwave, then the coaxial cable, fiber optic cable, twisted pair, DSL or wireless technologies such as infrared, radio and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement (s). For example, the terms "instructions" and "code" may refer to one or more programs, routines, sub-routines, functions, procedures, etc. "Instructions" and "code" may comprise a single computer-readable statement or many computer-readable statements.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 2, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods and apparatus described herein without departing from the scope of the claims.

What is claimed is:

1. A variable supply rail generator, comprising:
   a buck regulator configured to use an estimated load current for a power amplifier to optimize efficiency, wherein the estimated load current comprises a power amplifier current and a filter capacitor current, wherein the buck regulator provides a positive variable supply rail to the power amplifier,
   a negative charge pump, wherein the buck regulator provides a positive variable supply rail to the negative charge pump, and wherein the negative charge pump provides a negative variable supply rail to the power amplifier; and,
   a power amplifier controller that provides the estimated load current to the regulator, wherein the power amplifier controller provides a variable frequency clock signal to the negative charge pump that optimizes the power efficiency of the negative charge pump.

2. The variable supply rail generator of claim 1, wherein the power amplifier controller provides a reference signal corresponding to prior knowledge of an input signal in a digital signal chain to the buck regulator via a digital-to-analog converter.

3. The variable supply rail generator of claim 1, further comprising a flyback regulator, wherein the power amplifier controller provides the estimated load current to the flyback regulator, wherein the buck regulator provides a positive variable supply rail to the power amplifier, and wherein the flyback regulator provides a negative variable supply rail to the power amplifier.

4. The variable supply rail generator of claim 1, wherein the power amplifier controller provides a reference signal corresponding to prior knowledge of an input signal in a digital signal chain to the buck regulator and the flyback regulator via a digital-to-analog converter.

5. The variable supply rail generator of claim 1, wherein the variable supply rail generator operates in an enhanced pulse frequency modulation mode.

6. The variable supply rail generator of claim 1, wherein the estimated load current is dependent on peak/valley current boundaries.

7. The variable supply rail generator of claim 6, wherein the current boundaries are set around a current limit when an output voltage drops below a reference voltage.

8. The variable supply rail generator of claim wherein the power amplifier current is based on an input voltage, a load resistance and a tolerance, and wherein the filter capacitor current is determined from a rate of change of an envelope.

9. The variable supply rail generator of claim 8, wherein the load resistance used for the estimated load current is based on an adaptive value from an impedance detection module.

10. A method for generating a variable supply rail, comprising:
receiving an input parameter corresponding to a power amplifier;
estimating a load current for the power amplifier using the input parameter;
generating a positive variable supply rail using the estimated load current;
providing the positive variable supply rail to the power amplifier;
generating a negative variable supply rail using the estimated load current; and
providing the negative variable supply rail to the power amplifier,
wherein the positive variable supply rail is generated using a buck regulator,
wherein the negative variable supply rail is generated using a negative charge pump.

11. The method of claim 10, wherein the negative variable supply rail is generated using a flyback regulator.

12. The method of claim 10, wherein the method is performed by a variable supply rail generator, comprising:
a regulator configured to use an estimated load current for a power amplifier to optimize efficiency; and
a power amplifier controller that provides the estimated load current to the regulator.

13. The method of claim 12, wherein the buck regulator provides a positive variable supply rail to the power amplifier.

14. The method of claim 13, further comprising a negative charge pump, wherein the buck regulator provides a positive variable supply rail to the negative charge pump, and wherein the negative charge pump provides a negative variable supply rail to the power amplifier.

15. The method of claim 14, wherein the power amplifier controller provides a variable frequency clock signal to the negative charge pump that optimizes the power efficiency of the negative charge pump.

16. The method of claim 12, wherein the power amplifier controller provides a reference signal corresponding to prior knowledge of an input signal in a digital signal chain to the buck regulator via a digital-to-analog converter.

17. The method of claim 12, further comprising a flyback regulator, wherein the power amplifier controller provides the estimated load current to the flyback regulator, wherein the buck regulator provides a positive variable supply rail to the power amplifier, and wherein the flyback regulator provides a negative variable supply rail to the power amplifier.

18. The method of claim 17, wherein the power amplifier controller provides a reference signal corresponding to prior knowledge of an input signal in a digital signal chain to the buck regulator and the flyback regulator via a digital-to-analog converter.

19. The method of claim 12, wherein the variable supply rail generator operates in an enhanced pulse frequency modulation mode.

20. The method of claim 12, wherein the estimated load current is dependent on peak/valley current boundaries.

21. The method of claim 20, wherein the current boundaries are set around a current limit when an output voltage drops below a reference voltage.

22. The method of claim 12, wherein the estimated load current comprises a power amplifier current and a filter capacitor current.

23. The method of claim 22, wherein the power amplifier current is based on an input voltage, a load resistance and a tolerance, and wherein the filter capacitor current is determined from a rate of change of an envelope.

24. The method of claim 22, wherein the load resistance used for the estimated load current is based on an adaptive value from an impedance detection module.

* * * * *